United States Patent
Wang

(10) Patent No.: US 8,659,062 B2
(45) Date of Patent: Feb. 25, 2014

(54) METHOD OF MANUFACTURING A FERROELECTRIC CAPACITOR AND A FERROELECTRIC CAPACITOR

(75) Inventor: Wensheng Wang, Yokohama (JP)

(73) Assignee: Fujitsu Semiconductor Limited, Yokohama (JP)

( * ) Notice: Subject to any disclaimer, the term of this patent is extended or adjusted under 35 U.S.C. 154(b) by 0 days.

(21) Appl. No.: 13/616,009

(22) Filed: Sep. 14, 2012

(65) Prior Publication Data

US 2013/0003256 A1    Jan. 3, 2013

Related U.S. Application Data

(62) Division of application No. 13/110,510, filed on May 18, 2011.

(30) Foreign Application Priority Data

Aug. 4, 2010    (JP) .................................. 2010-175726

(51) Int. Cl.
    *H01L 27/108*    (2006.01)

(52) U.S. Cl.
    USPC ............... 257/295; 257/300; 257/310; 438/3; 438/240

(58) Field of Classification Search
    USPC ....................... 257/295, 310, 300; 438/3, 240
    See application file for complete search history.

(56) References Cited

U.S. PATENT DOCUMENTS

| | | | |
|---|---|---|---|
| 6,194,228 B1 | 2/2001 | Fujiki et al. | |
| 6,624,458 B2 | 9/2003 | Takamatsu et al. | |
| 7,812,425 B2 | 10/2010 | Yamakawa et al. | |
| 2002/0117700 A1 | 8/2002 | Fox | |
| 2005/0136556 A1* | 6/2005 | Matsuura et al. | 438/3 |
| 2006/0231880 A1 | 10/2006 | Yamakawa et al. | |
| 2008/0035970 A1* | 2/2008 | Wang | 257/295 |

(Continued)

FOREIGN PATENT DOCUMENTS

| | | |
|---|---|---|
| JP | 11-195768 A | 7/1999 |
| JP | 2002-261251 A | 9/2002 |
| JP | 2002-324894 A | 11/2002 |
| JP | 2009-094200 A | 4/2009 |

OTHER PUBLICATIONS

U.S. Office Action dated Oct. 26, 2012, issued in corresponding U.S. Appl. No. 13/110,510.

(Continued)

*Primary Examiner* — Chuong A Luu
(74) *Attorney, Agent, or Firm* — Westerman, Hattori, Daniels & Adrian, LLP

(57) ABSTRACT

A lower electrode film is formed above a substrate. A ferroelectric film is formed above the lower electrode film. An amorphous intermediate film of a perovskite-type conductive oxide is formed above the ferroelectric film. A first upper electrode film comprising oxide of at least one metal selected from a group of Pt, Pd, Rh, Ir, Ru, and Os is formed on the intermediate film. The intermediate film is crystallized by carrying out a first heat treatment in an atmosphere containing an oxidizing gas after the formation of the first upper electrode film. After the first heat treatment, a second upper electrode film comprising oxide of at least one metal selected from a group of Pt, Pd, Rh, Ir, Ru, and Os is formed on the first upper electrode film, at a temperature lower than the growth temperature for the first upper electrode film.

7 Claims, 14 Drawing Sheets

(56) References Cited

U.S. PATENT DOCUMENTS

2008/0061331 A1* 3/2008 Wang et al. .................. 257/295
2009/0091876 A1 4/2009 Yamakawa et al.
2010/0330769 A1 12/2010 Yamakawa et al.

OTHER PUBLICATIONS

U.S. Final Office Action dated Jun. 20, 2013, issued in U.S. Appl. No. 13/110,510.

* cited by examiner

METHOD OF MANUFACTURING A FERROELECTRIC CAPACITOR AND A FERROELECTRIC CAPACITOR

CROSS-REFERENCE TO RELATED APPLICATIONS

This is a divisional application of U.S. application Ser. No. 13/110,510 filed May 18, 2011, which is based upon and claims the benefit of priority of the prior Japanese Patent Application JP2010-175726, filed on Aug. 4, 2010, the entire contents of which are incorporated herein by reference.

FIELD

The embodiments discussed herein are related to a ferroelectric capacitor production method and a ferroelectric capacitor.

BACKGROUND

The ferroelectric memory using ferroelectric capacitors is known as a nonvolatile memory. The ferroelectric memory utilizes the hysteresis characteristics of a ferroelectric substance to store data. Oxidation resistant metals such as Pt or electrically conductive oxides such as IrOx and RuOx are used as material for the upper electrode of a ferroelectric capacitor.

A ferroelectric capacitor having a two-layered upper electrode structure in which the composition of the upper layer is closer to the stoichiometric composition than the lower layer has been proposed. This constitution is expected to improve the capacitor characteristics.

A ferroelectric capacitor, the upper electrode of which consists of two layers, i.e. a $SrRuO_3$ layer and a Pt layer, has been proposed. The $SrRuO_3$ layer serves to depress the fatigue of the ferroelectric film.

A ferroelectric capacitor, the upper electrode of which consists of two layers, i.e. a highly conducting layer and an amorphous iridium oxide layer, has been proposed. The highly conducting layer is made of crystalline iridium oxide, $SrRuO_3$, or the like.

A ferroelectric capacitor, the upper electrode of which consists of three layers, i.e. a $SrRuO_3$ film, an oxygen-rich iridium oxide film, and an $IrO_2$ film, has been proposed.

PATENT DOCUMENTS

[Patent document 1] Japanese Unexamined Patent Publication No. 2002-324894
[Patent document 2] Japanese Unexamined Patent Publication No. HEI 11-195768
[Patent document 3] Japanese Unexamined Patent Publication No. 2002-261251
[Patent document 4] Japanese Unexamined Patent Publication No. 2009-94200

SUMMARY

If an electrically conductive oxide film such as $SrRuO_3$ is formed on a ferroelectric film, it can depress the diffusion of Pb in the ferroelectric film and the oxygen deficiency in the ferroelectric material. However, when a $SrRuO_3$ film was actually formed on a ferroelectric film, followed by the formation of an electrode of iridium oxide or the like by a conventional method to produce a ferroelectric capacitor, it was found difficult to achieve an intended switching charge (Qsw).

According to an aspect of the invention, a method for manufacturing a ferroelectric capacitor includes:
forming a lower electrode film above a substrate;
forming a ferroelectric film above the lower electrode film;
forming an amorphous intermediate film of a perovskite-type conductive oxide above the ferroelectric film;
forming a first upper electrode film comprising an oxide of at least one metal selected from a group consisting of Pt, Pd, Rh, Ir, Ru, and Os, above the intermediate film;
crystallizing the intermediate film by carrying out a first heat treatment in an atmosphere containing an oxidizing gas after the formation of the first upper electrode film; and
forming, after the first heat treatment and above the first upper electrode film, a second upper electrode film comprising an oxide of at least one metal selected from a group consisting of Pt, Pd, Rh, Ir, Ru, and Os at a temperature lower than a growth temperature for the first upper electrode film.

According to another aspect of the invention, a ferroelectric capacitor includes:
a lower electrode formed above a substrate;
a ferroelectric film comprising columnar crystal grains, the ferroelectric film being located above the lower electrode;
an intermediate film located above the ferroelectric film and made of a perovskite-type conductive oxide, the intermediate film comprising columnar crystal grains;
a first upper electrode located above the intermediate film and made of oxide of at least one metal selected from a group consisting of Pt, Pd, Rh, Ir, Ru, and Os, the first upper electrode comprising columnar crystal grains; and
an amorphous or microcrystalline second upper electrode located above the first upper electrode and made of oxide of at least one metal selected from a group consisting of Pt, Pd, Rh, Ir, Ru, and Os.

The object and advantages of the invention will be realized and attained by means of the elements and combinations particularly pointed out in the claims.

It is to be understood that both the foregoing general description and the following detailed description are exemplary and explanatory and are not restrictive of the invention, as claimed.

DESCRIPTION OF EMBODIMENTS

Embodiment 1

The method for producing the ferroelectric capacitor according to Embodiment 1 is described below with reference to FIG. 1A to 1F.

Figure 1A:
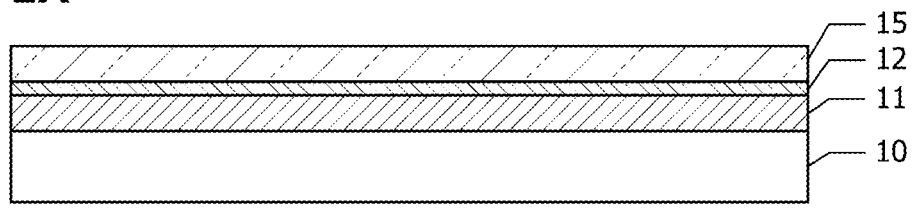
FIG. 1A to FIG. 1E are cross sections of a substrate at intermediate stages of a method for producing a ferroelectric capacitor according to the Embodiment 1.

As illustrated in FIG. 1A, a lower electrode film 11 is formed on a substrate 10. The lower electrode film 11 is made of a noble metal such as Pt, Pd, Rh, Ir, Ru, and Os. A lower electrode film 11 of Pt is used in Embodiment 1. The thickness of the lower electrode film 11 is in the range of, for instance, 50 nm to 150 nm. The formation of the lower electrode film 11 is carried out by, for instance, sputtering. The film forming conditions are, for instance, as follows:
substrate temperature: 350° C.;
sputtering gas: Ar;
pressure: 1 Pa; and
DC power: 0.3 kW.

After the formation of the lower electrode film 11, heat treatment is carried out to improve the crystallinity. This heat treatment is performed by, for instance, rapid thermal annealing (RTA). The heat treatment conditions are, for instance, as follows:
atmosphere: inert gas, such as Ar;
heat treatment temperature: 650° C.; and
heat treatment time: 60 seconds.

A noble metal oxide film 12 in an amorphous state is formed on the lower electrode film 11. The noble metal oxide film 12 contains a noble metal such as, for instance, Pt, Pd, Rh, Ir, Ru, or Os. The noble metal oxide film 12 in Embodiment 1 contains Pt as noble metal. The thickness of the noble metal oxide film 12 is in the range of, for instance, 0.1 nm to 3 nm. The formation of the noble metal oxide film 12 is carried out by, for instance, sputtering. The film forming conditions are, for instance, as follows:
substrate temperature: 100° C. to 400° C.;
sputtering gas: Ar and $O_2$ (Flow ratio of Ar to $O_2$ is 20:80);
pressure: 1 Pa; and
DC power: 0.1 W to 0.3 W.

After the formation of the lower electrode film 11, the noble metal oxide film 12 may be formed by leaving the lower electrode film 11 in the atmosphere to naturally oxidize the surface of the lower electrode film 11.

A first ferroelectric film 15 is formed on the noble metal oxide film 12. A perovskite-type ferroelectric of lead zirconate titanate (PZT), PZT containing La (PLZT), or PZT containing La, Ca and Sr (CSPLZT) is used as material for the first ferroelectric film 15. CSPLZT is used in Embodiment 1. The thickness of the first ferroelectric film 15 is in the range of, for instance, 30 nm to 150 nm. The formation of the first ferroelectric film 15 is carried out by, for instance, RF sputtering. The film forming conditions are, for instance, as follows:
target: CSPLZT;
substrate temperature: 30° C. to 100° C.;
sputtering gas: Ar;
pressure: 0.8 Pa to 1.1 Pa; and
RF power: 1.0 kW.

The first ferroelectric film 15 as formed under the above conditions is not crystallized but is in an amorphous state.

The deposition of the first ferroelectric film 15 may be performed by metal-organic chemical vapor deposition (MOCVD), sol-gel process, metal-organic decomposition (MOD), chemical solution deposition (CSD), CVD, or epitaxial growth. If MOCVD is used, the first ferroelectric film 15 is crystallized when film formation is completed.

Figure 1B:
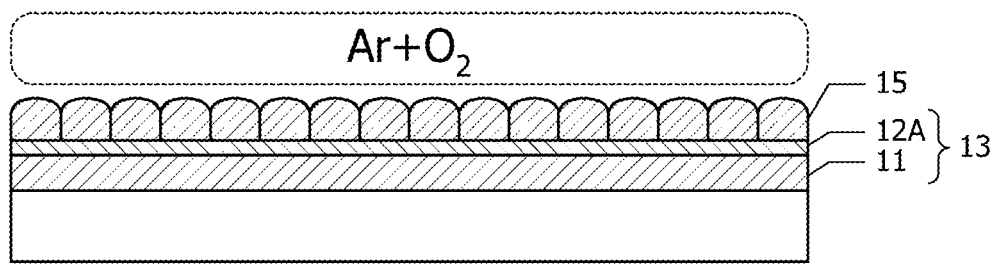

As illustrated in FIG. 1B, the first ferroelectric film 15 is crystallized by carrying out RTA in a mixed gas of Ar and $O_2$. The heat treatment conditions are, for instance, as follows:
heat treatment temperature: 550° C. to 650° C.; and
heat treatment time: 90 seconds.

By this heat treatment, the first ferroelectric film 15 is crystallized to form a first ferroelectric film 15 having a columnar crystal structure. The "columnar crystal structure" as refers to herein means a structure in which individual crystal grains extend through the crystalline film from bottom to the top face, and such crystal grains are distributed in the in-plane direction. The in-plane size of each of the crystal grains is in the range of 20 nm to 200 nm.

In addition, this heat treatment works to reduce the noble metal oxide film 12 in an amorphous (FIG. 1A) to produce a noble metal film 12A. The oxygen in the noble metal oxide film 12 diffuses in the first ferroelectric film 15 to compensate the oxygen deficiency in the first ferroelectric film 15. The lower electrode film 11 and the noble metal film 12A will serve as the lower electrode film 13 of the ferroelectric capacitor. A better interface between the lower electrode film 13 and the first ferroelectric film 15 is ensured as compared with the case where the first ferroelectric film 15 is formed directly on the lower electrode film 11. In view of the contact and crystallographic continuity between the lower electrode film 11 and the noble metal film 12A, it is preferable that the noble metal contained in the noble metal oxide film 12 (FIG. 1B) is the same as that in the lower electrode film 11.

Figure 1C:
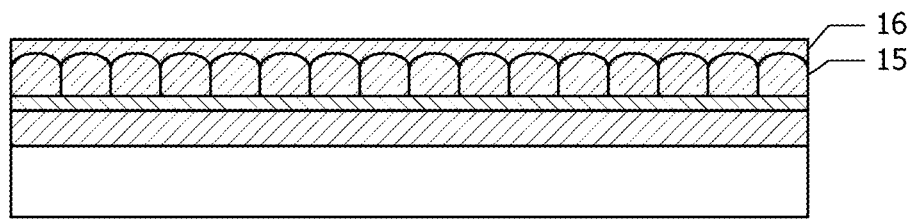

As illustrated in FIG. 1C, an amorphous or microcrystalline second ferroelectric film 16 is formed on the crystallized first ferroelectric film 15. For the second ferroelectric film 16, the same material as for the first ferroelectric film 15 is used. The thickness of the second ferroelectric film 16 is, for instance, in the range of 5 nm to 20 nm. The formation of the first ferroelectric film 15 is carried out by, for instance, RF sputtering. The film forming conditions are the same as the sputtering conditions used for forming the first ferroelectric film 15. The surface of the second ferroelectric film 16 is higher in evenness than the surface of the crystallized first ferroelectric film 15.

Figure 1D:
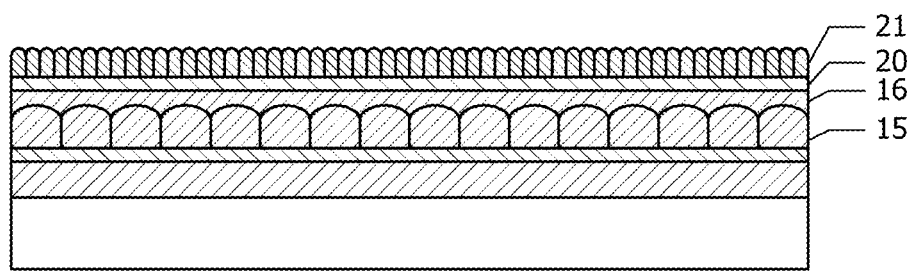

As illustrated in FIG. 1D, an amorphous intermediate film 20 is formed on the second ferroelectric film 16. A perovskite-type electrically conductive oxide is used as material for the intermediate film 20. Examples include electrically conductive substances containing Sr, Ru, and O, such as $SrRuO_3$, electrically conductive substances containing Sr, Ti, and O, such as $SrTiO_3$, electrically conductive substances containing La, Sr, Mn, and O, such as $LaSrMnO_3$, and electrically conductive substances containing La, Sr, Co, and O, such as $LaSrCoO_3$. $SrRuO_3$ (hereinafter abbreviated as "SRO") is used in Embodiment 1. The thickness of the intermediate film 20 is, for instance, in the range of 1 nm to 5 nm. The film forming conditions for the intermediate film 20 are, for instance, as follows:
target: SRO ceramic material containing 2 wt % $Bi_2O_3$;
substrate temperature: room temperature to 350° C. (more preferably 50° C. to 70° C.);
sputtering gas: Ar;
pressure: 0.5 Pa; and
DC power: 0.35 kW.

A crystalline first upper electrode film 21 is formed on the intermediate film 20. For instance, iridium oxide is used as material for the first upper electrode film 21. The thickness of the first upper electrode film 21 is, for instance, in the range of 10 nm to 70 nm, more preferably 20 nm to 50 nm. The formation of the first upper electrode film 21 is carried out by, for instance, reactive sputtering. The film forming conditions are, for instance, as follows:
substrate temperature: 150° C. to 350° C.;
sputtering gas: mixed gas of Ar and $O_2$ (Flow ratio of Ar to $O_2$ is 70:30.);
pressure: 2 Pa; and
DC power: 1 kW.

The first upper electrode film 21 formed at a substrate temperature as described above is in a crystallized state and has a columnar crystal structure. As compared with the crystallized second ferroelectric film 16 which has an in-plane crystal grain size in the range of 20 nm to 200 nm, the first upper electrode film 21 has a smaller in-plane crystal grain size in the range of 1 nm to 10 nm.

Figure 1E:
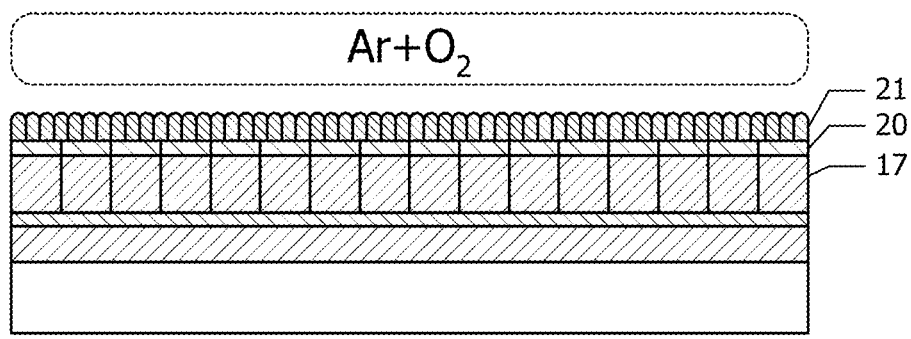

As illustrated in FIG. 1E, RTA is carried out in an oxygen-containing atmosphere. The heat treatment conditions are, for instance, as follows:
heat treatment temperature: 700° C. to 750° C.;
heat treatment time: 120 seconds;
atmosphere gas: mixed gas of Ar and $O_2$; and
ratio of $O_2$ flow rate to the total flow rate: 1.0% to 20%.

The amorphous or microcrystalline second ferroelectric film 16 (FIG. 1D) is crystallized by this heat treatment. Here, crystals start to grow from the crystal grains in the first ferroelectric film 15 (FIG. 1D) which has already been crystallized. Consequently, the first ferroelectric film 15 and the second ferroelectric film 16 are integrated into a ferroelectric film 17 that has a columnar crystal structure. In the intermediate film 20, furthermore, crystals start to grow from the crystal grains in the ferroelectric film 17, resulting in an intermediate film 20 that also has a columnar crystal structure.

The surface of the substrate is amorphous when the first upper electrode film 21 (FIG. 1D) is formed, and therefore, the interface between the intermediate film 20 and the first upper electrode film 21 is higher in evenness than in the case where it is formed on a crystallized film. This can improve the electric characteristics of the ferroelectric capacitor. The intermediate film 20 works to prevent the mutual diffusion of the constituent elements of the ferroelectric film 17 and those of the first upper electrode film 21. Consequently, ferroelectricity can be prevented from being decreased or lost caused by the diffusion of constituent elements of the first upper electrode film 21 to the surface layer of the ferroelectric film 17.

During the heat treatment process, oxygen is supplied to the ferroelectric film 17 through the first upper electrode film 21 and the intermediate film 20. This compensates the oxygen deficiency in the ferroelectric film 17. Because of its columnar crystal structure, the first upper electrode film 21 is higher in oxygen permeability than in the case where it is amorphous or micro crystallite. As a result, oxygen can be adequately supplied to the ferroelectric film 17. It is not necessary for the first upper electrode film 21 to have an excessively large thickness for oxygen to be permeated.

This heat treatment also serves to improve the contact between the ferroelectric film 17 and the first upper electrode film 21.

The in-plane conditions of the interface between the ferroelectric film 17 and the first upper electrode film 21 will tend to decrease in uniformity if the temperature of the heat treatment is lower than 700° C. Evaporation of Pb in the ferroelectric film 17, decomposition of SRO, and the like tend to take place if the temperature of the heat treatment is higher than 750° C. Thus, it is preferable as described above that the temperature of the heat treatment is in the range of 700° C. to 750° C.

The ratio of a flow rate of $O_2$ to the total flow rate is preferably equal to or lower than 20% to prevent anomalous oxidation.

Figure 1F:
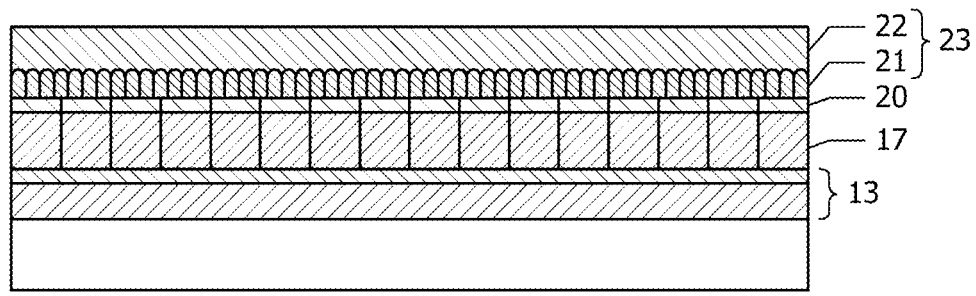
FIG. 1F is a cross section of the completed ferroelectric capacitor.

As illustrated in FIG. 1F, an amorphous or microcrystalline second upper electrode film 22 is formed on the first upper electrode film 21. For instance, iridium oxide is used as material for the second upper electrode film 22. The thickness of the second upper electrode film 22 is, for instance, in the range of 70 nm to 200 nm. The formation of the second upper electrode film 22 is carried out by, for instance, sputtering. The film forming conditions are, for instance, as follows:
substrate temperature: 0° C. to 100° C.;
sputtering gas: mixed gas of Ar and $O_2$;
ratio of $O_2$ flow rate to the total flow rate: 40% or more;
pressure: 1.5 Pa to 2.0 Pa; and
DC power: 1 kW.

The substrate temperature is controlled to be lower than the substrate temperature used to form the first upper electrode film 21 to cause the second upper electrode film 22 to have an amorphous or microcrystalline structure instead of a columnar crystal structure. The composition of the second upper electrode film 22 is closer to the stoichiometric composition than that of the first upper electrode film 21. The second upper electrode film 22 which is amorphous or microcrystalline and has a nearly stoichiometric composition will function more effectively to prevent the diffusion of moisture and hydrogen than the first upper electrode film 21 which has a columnar crystal structure and has a smaller oxygen content than that for the stoichiometric composition. Consequently, the second upper electrode film 22 can function to depress the supply of moisture and hydrogen to the ferroelectric film 17 in the subsequent steps. Thus, the second upper electrode film 22 preferably has a larger thickness than the first upper electrode film 21.

The two layers, i.e. the first upper electrode film 21 and the second upper electrode film 22, serves as the upper electrode film 23 of the ferroelectric capacitor.

In Embodiment 1, the film forming temperature for the first upper electrode film 21 in the step illustrated in FIG. 1D is adjusted equal to or higher than 150° C. Consequently, the moisture adsorbed on the intermediate film 20 is removed during the film formation of the first upper electrode film 21. If moisture remains in the intermediate film 20, it diffuses in the ferroelectric film 17, leading to deterioration in the electric characteristics of the ferroelectric capacitor. If the first upper electrode film 21 is formed at a temperature equal to or higher than 150° C., deterioration in the electric characteristics of the ferroelectric capacitor caused by the residual moisture can be prevented.

If the film forming temperature is adjusted equal to or lower than 350° C., anomalous growth can be suppressed and defect generation in the interface between the first upper electrode film 21 and the ferroelectric film 17 can be suppressed.

Figure 2:
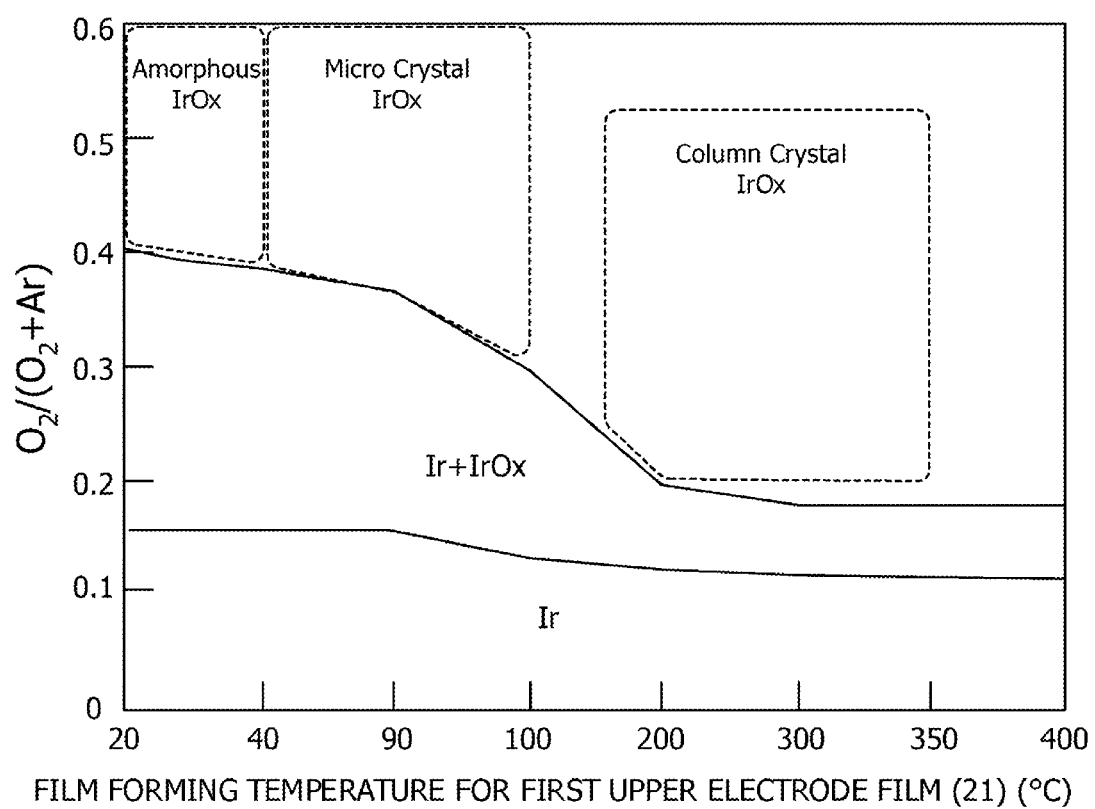
FIG. 2 is a graph illustrating the relation among the film forming temperature for the first upper electrode film, the flow ratio of oxygen during film formation and the state of the film produced.

FIG. 2 illustrates the relation among the film forming temperature for the first upper electrode film 21 given in FIG. 1D, the ratio of a flow rate of $O_2$ gas to the total sputtering gas flow rate (hereinafter referred to as "oxygen flow ratio") and the composition and crystal conditions of the first upper electrode film 21. The DC power during the film formation was set to 1 kW.

If the oxygen flow ratio in the sputtering gas is equal to or less than about 12%, a metallic iridium film is formed instead of an iridium oxide film. The resulting iridium film has a columnar crystal structure. If the oxygen flow ratio is higher than 12%, the resulting film will contain both iridium oxide and metallic iridium. If the oxygen flow ratio is increased further, metallic iridium will not be formed and an iridium oxide film only will be formed. The boundary between the oxygen flow ratio where the film containing both metallic iridium and iridium oxide is formed and that where only the iridium oxide film is formed depends on the film forming temperature.

Even if the film forming temperature and the oxygen flow ratio meet the conditions under which only the iridium oxide film is formed, the resulting iridium oxide film will be in an amorphous state if the film forming temperature is equal to or lower than 40° C. The resulting iridium oxide film will be in a microcrystalline state if the film forming temperature is in the range of 40° C. to 100° C. The film forming temperature is preferably in the range of 150° C. to 350° C. to form an iridium oxide film that has a columnar crystal structure. The preferable range of the oxygen flow ratio is about 20% to 50%.

The oxygen flow ratio for forming the second upper electrode film 22 is preferably higher than that for forming the first upper electrode film 21 in order to allow the composition of the second upper electrode film 22 to be close to the stoichiometric composition.

The preferable range of oxygen flow ratio to form a columnar crystal structure illustrated in FIG. 2 changes with the DC power. If the DC power is reduced from 1 kW to 0.5 kW, for instance, the preferable oxygen flow ratio will decrease to about a half of that for a DC power of 1 kW. If the DC power is boosted from 1 kW to 2 kW, the preferable oxygen flow ratio will be twice as large as that for a DC power of 1 kW.

The in-plane size of the crystal grains in the first upper electrode film 21 having a columnar crystal structure depends on film forming conditions including the substrate temperature during film formation, oxygen flow ratio, and DC power. As the DC power increases, the resulting iridium oxide film will have a lower oxidation degree (i.e. the oxygen content will decrease), and the size of crystal grains will increase. Anomalous growth will be more likely to take place as the oxidation degree of the iridium oxide film increases. If the iridium oxide film is formed under the condition that anomalous growth is suppressed, the resulting iridium oxide film will have an in-plane crystal grain size in the range of 1 nm to 10 nm. It is preferable, therefore, that the first upper electrode film 21 is formed under the condition that the in-plane crystal grain size in the range of 1 nm to 10 nm is ensured.

Figure 3:
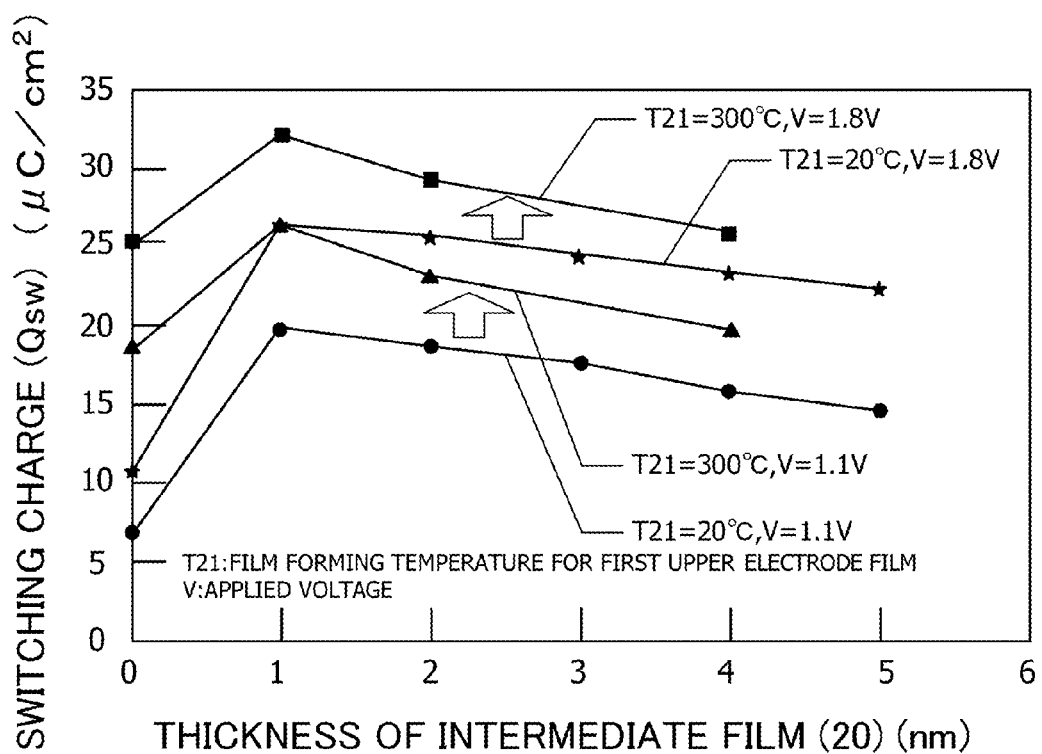
FIG. 3 is a graph illustrating the relation of the thickness of the intermediate film with the value of Qsw.

FIG. 3 illustrates the relation of the thickness of the intermediate film 20 with the Qsw value of the ferroelectric capacitor formed. The horizontal axis represents the thickness of the intermediate film 20 in the unit of "nm" while the longitudinal axis represents the value of Qsw in the unit of "$\mu C/cm^2$". Here, the thickness of the first ferroelectric film 15 (FIG. 1B) was 70 nm, and the thickness of the second ferroelectric film 16 (FIG. 1C) was 10 nm. The thickness of the intermediate film 20 (FIG. 1D) was changed in the range of 0 nm to 5 nm. A sample for a comparative example and a sample according to Embodiment 1 were prepared. The first upper electrode film 21 (FIG. 1D) of the sample for the comparative example was formed at 20° C., and the first upper electrode film 21 of the sample according to Embodiment 1 was formed at 300° C. The value of Qsw was measured with an applied voltage of 1.1 V and 1.8 V.

The solid dots and the solid stars respectively indicate measurement results obtained when applying a voltage of 1.1 V and 1.8 V to the sample for the comparative example. The solid triangles and the solid squares respectively indicate measurement results obtained when applying a voltage of 1.1 V and 1.8 V to a sample according to Embodiment 1. In a precise sense, a sample with an intermediate film thickness of 0 nm, i.e. a sample without an intermediate film 20, does not meet the requirements for Embodiment 1.

It can be seen that the existence of the intermediate film 20 leads to a larger value of Qsw. However, the value of Qsw gradually decreases as the thickness of the intermediate film 20 increases. This is considered to arise as a consequence of diffusion of substances in the intermediate film 20 into the ferroelectric film 17. From these results, it was found that the existence of the intermediate film 20 effectively improves the value of Qsw if the thickness of the intermediate film 20 is in the range of 1 nm to 5 nm.

It can be seen that the value of Qsw increases as the film forming temperature for the first upper electrode film 21 is raised from 20° C. to 300° C. This is because moisture in the intermediate film 20 was removed during the film formation of the first upper electrode film 21. As a result of the removal of moisture in the intermediate film 20, the deterioration in the ferroelectricity of the ferroelectric film 17 caused by moisture is depressed. As the first upper electrode film 21 is formed at a high temperature, furthermore, impurities adhering on the surface of the intermediate film 20 are removed more easily during the film formation of the first upper electrode film 21. As a result of the removal of these impurities, the deterioration in the ferroelectricity caused by the diffusion of impurities into the ferroelectric film 17 is also depressed. This is considered to serve to increase the value of Qsw.

Figure 4:
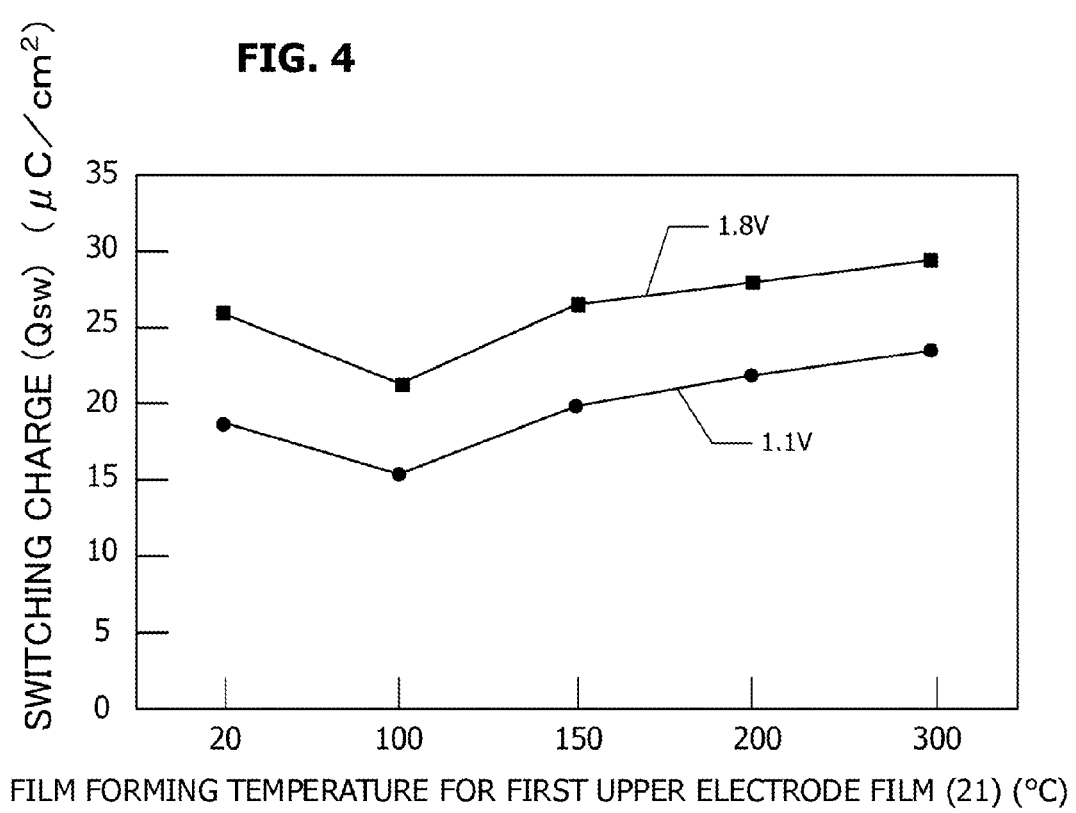
FIG. 4 is a graph illustrating the relation of the film forming temperature for the first upper electrode film with the value of Qsw.

FIG. 4 illustrates the relation of the film forming temperature for the first upper electrode film 21 (FIG. 1D) with the value of Qsw of the ferroelectric capacitor formed. The horizontal axis represents the film forming temperature for the first upper electrode film 21 in the unit of "° C." while the longitudinal axis represents the value of Qsw in the unit of "$\mu C/cm^2$". The thickness of the first ferroelectric film 15 (FIG. 1B) was 70 nm, and the thickness of the second ferroelectric film 16 (FIG. 1C) was 10 nm. The intermediate film 20 (FIG. 1D) had a thickness of 1 nm. The solid dots and the solid squares respectively indicate the value of Qsw at an applied voltage of 1.1 V and 1.8 V.

When the film forming temperature for the first upper electrode film 21 is 100° C., the value of Qsw is lower than when the film forming temperature is 20° C. This decrease in the value of Qsw is considered to arise as the consequence of diffusion of impurities adhering on the surface of the intermediate film 20 to the second ferroelectric film 16 (FIG. 1D) during the film formation of the first upper electrode film 21. As illustrated in FIG. 2, when the film forming temperature is 100° C., the first upper electrode film 21 is in a microcrystalline state, i.e. a state between amorphous and columnar crystalline. This suggests that the first upper electrode film 21 had a low in-plane uniformity and that a good interface was not formed between the first upper electrode film 21 and the second ferroelectric film 16. The absence of a good interface is also considered to be a factor in the decrease in the value of Qsw.

When the film forming temperature for the first upper electrode film 21 was equal to or higher than 150° C., the value of Qsw was larger than when the film forming temperature was 20° C. This is considered to have resulted from the removal of impurities adhering on the surface of the intermediate film 20 and moisture in the intermediate film 20. To prevent anomalous growth, it is preferable that the film forming temperature for the first upper electrode film 21 is equal to or less than 350° C.

Figure 5:
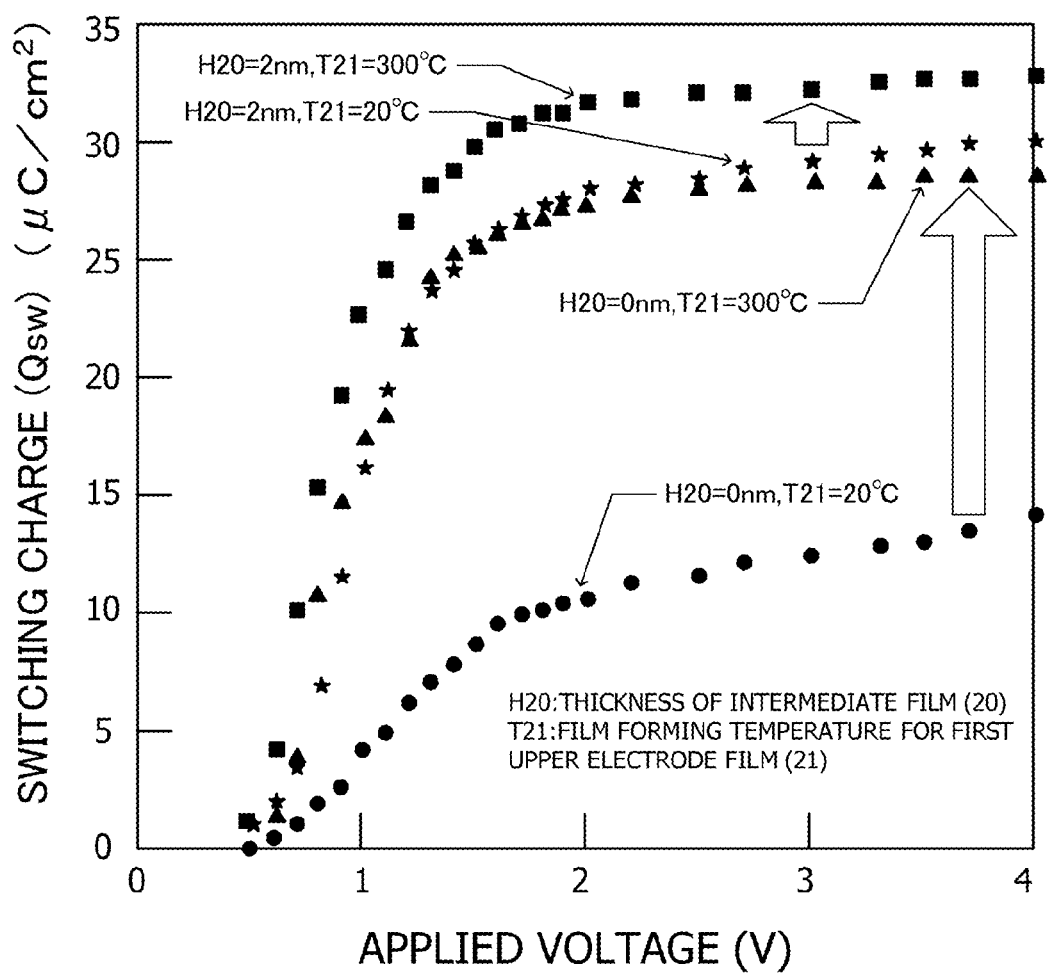
FIG. 5 is a graph illustrating the relation of the applied voltage with the value of Qsw.

FIG. 5 illustrates the relation between the applied voltage and the value of Qsw. The horizontal axis represents the applied voltage in the unit of "V", while the longitudinal axis represents the value of Qsw in the unit of "$\mu C/cm^2$". The solid squares indicate measurement results of the sample according to Embodiment 1. The thickness of the first ferroelectric film 15 (FIG. 1B) was 70 nm, and the thickness of the second ferroelectric film 16 (FIG. 1C) was 10 nm. The thickness of the intermediate film 20 (FIG. 1D) was 2 nm, and the film forming temperature for the first upper electrode film 21 was 300° C. For comparison, the stars indicate measurement results of a sample prepared at a film forming temperature for the first upper electrode film 21 of 20° C. In addition, measurement results of samples without the intermediate film 20 are indicated by solid dots and solid triangles. The solid dots and the solid triangles were obtained from samples prepared at a film forming temperature for the first upper electrode film 21 of 20° C. and 300° C., respectively.

It can be seen that regardless of whether the intermediate film 20 exists, the value of Qsw increases as the film forming temperature for the first upper electrode film 21 is raised from 20° C. to 300° C. It can be also seen that the value of Qsw of the sample according to Embodiment 1 that contains the intermediate film 20 is larger than the value of Qsw of the sample without the intermediate film (solid triangles) when the film forming temperature for the first upper electrode film 21 is 300° C.

Figure 6:
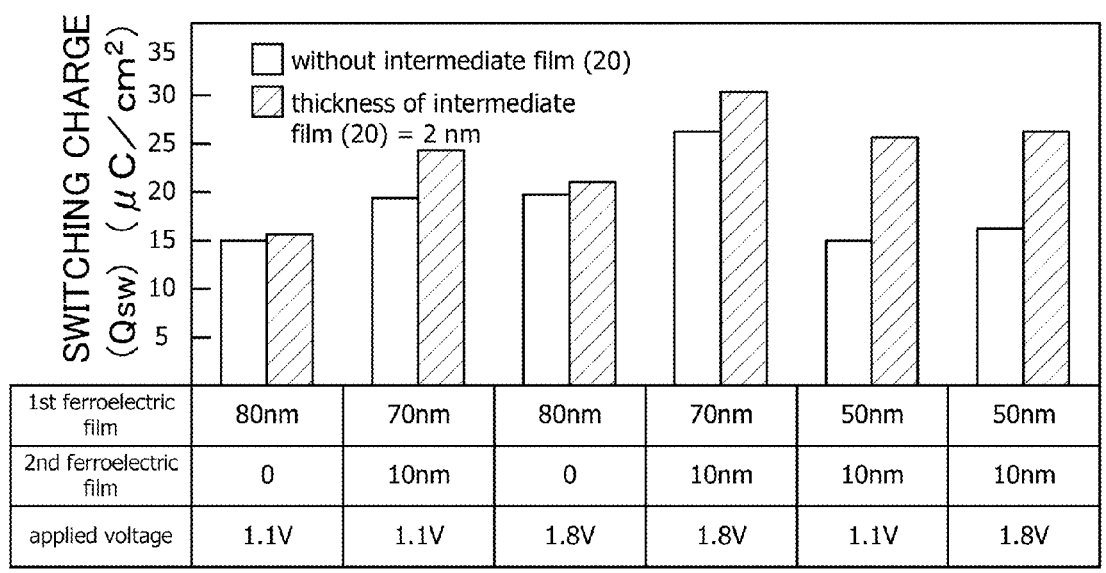
FIG. 6 is a graph comparing the values of Qsw of several ferroelectric capacitors that differ in the thickness of the first ferroelectric film and the thickness of the second ferroelectric film.

FIG. 6 illustrates measured values of Qsw of several samples that differ in the thickness of the first ferroelectric film 15 (FIG. 1B) and the thickness of the second ferroelectric film 16 (FIG. 1C). The applied voltage was 1.1V or 1.8V. FIG. 6 compares the sample that contains an intermediate film 20 with a thickness of 2 nm to the sample without the intermediate film. The film forming temperature for the first upper electrode film 21 was 300° C.

The samples in which the thickness of the second ferroelectric film is 0 has a structure consisting of an intermediate film 20 (FIG. 1D) or a first upper electrode film 21 (FIG. 1D) formed directly on the first ferroelectric film 15 illustrated in FIG. 1B. It is seen that the value of Qsw is larger for the samples that have a second ferroelectric film 16. This is because the formation of the amorphous or microcrystalline second ferroelectric film 16 serves to produce an even interface between the ferroelectric film 17 (FIG. 1E) and the first upper electrode film 21.

It can be seen that a larger value of Qsw is obtained by providing an intermediate film 20. This is because the intermediate film 20 works to prevent the mutual diffusion of substances between the ferroelectric film 17 and the first upper electrode film 21. In particular, the existence of the amorphous or microcrystalline second ferroelectric film 16 effectively allows the intermediate film 20 to work to improve the value of Qsw. This is attributed to the fact that the underlying surface was even when the intermediate film 20 is formed.

It can be seen that the increase in the value of Qsw caused by the intermediate film 20 is larger as the first ferroelectric film 15 is thinner. The causes for this are discussed below.

If the intermediate film 20 does not exist, substances in the first upper electrode film 21 diffuse into the ferroelectric film 17 to reduce or erase the ferroelectricity in some portions of the surface layer of the ferroelectric film 17. This is considered to cause a decrease in the value of Qsw. As the ferroelectric film 17 becomes thinner, the portions where the ferroelectricity is reduced or erased by diffused substances account for a larger proportion. This leads to a significant decrease in the value of Qsw. In other words, the existence of the intermediate film 20 has a larger effect as the ferroelectric film 17 becomes thinner.

Embodiment 2

The method for manufacturing a ferroelectric memory according to Embodiment 2 is described below with reference to FIG. 7A to FIG. 7J and FIG. 8.

Figure 7A:
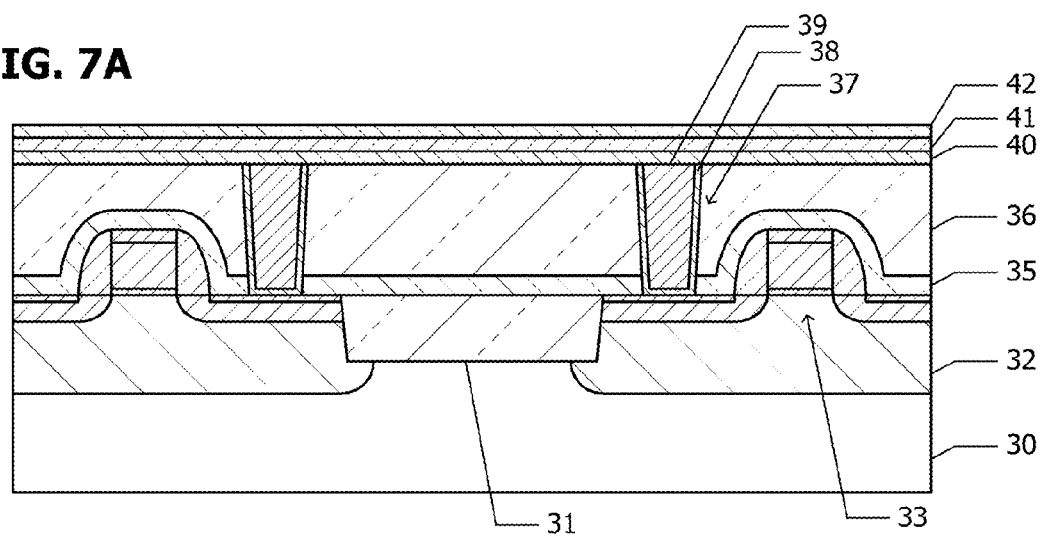
FIG. 7A to FIG. 7I are cross sections of a substrate at intermediate stages of a method for producing a ferroelectric memory according to the Embodiment 2.

As illustrated in FIG. 7A, a device-separating insulation film 31 is formed on the surface layer of the semiconductor substrate 30 consisting of silicon. The formation of the device-separating insulation film 31 is carried out by shallow trench isolation (STI), local oxidation of silicon (LOCOS), or the like. Then, p-type wells 32 are formed in the surface layer in the active regions separated by the device-separating insulation film 31. A MOS transistor 33 is formed in each active region.

To cover the MOS transistors 33, an insulation film 35 made of silicon oxynitride and the like is formed above the semiconductor substrate 30. The formation of the insulation film 35 is carried out by, for instance, plasma-enhanced chemical vapor deposition (plasma CVD). The thickness of the insulation film 35 is, for instance, 200 nm. An interlayer insulation film 36 made of silicon oxide and the like is formed on the insulation film 35. The formation of the interlayer insulation film 36 is carried out by, for instance, plasma CVD using tetraethoxysilan (TEOS). After the deposition of the interlayer insulation film 36, chemical mechanical polishing (CMP) is performed to make the surface even. The height of the top face of the interlayer insulation film 36 from the surface of the semiconductor substrate 30 is, for instance, 785 nm.

Via holes 37 are formed through the interlayer insulation film 36 and the insulation film 35. The via holes 37 have a diameter of, for instance, 0.25 µm. The side and bottom faces of each via hole 37 are covered with a glue film 38, and the via hole 37 is filled with an electrically conductive plug 39 of tungsten or the like. Each conductive plug 39 is electrically connected to the source or drain of each MOS transistor 33. The glue film 38 consists of two layers such as a Ti film with a thickness of 30 nm and a TiN film with a thickness of 20 nm.

An insulation film 40 of silicon oxynitride is formed on the interlayer insulation film 36 and the conductive plugs 39. The formation of the insulation film 40 is carried out by, for instance, plasma CVD. The insulation film 40 has a thickness of, for instance, 100 nm. An insulation film 41 of silicon oxide is formed on the insulation film 40. The formation of the insulation film 41 is carried out by, for instance, plasma CVD using TEOS. The insulation film 41 has a thickness of, for instance, 130 nm. The insulation films 40 and 41 prevent the oxidization of the conductive plug 39.

A glue film 42 of aluminum oxide is formed on the insulation film 41. The formation of the glue film 42 is carried out by, for instance, sputtering. The glue film 42 has a thickness of, for instance, 20 nm. The glue film 42 improves the adhesiveness of the lower electrode of the ferroelectric capacitor to be formed on top of the glue film 42. After the formation of the glue film 42, RTA is carried out in an oxygen atmosphere. For instance, the temperature of the heat treatment is 650° C., and the heat treatment time is 60 seconds.

Figure 7B:
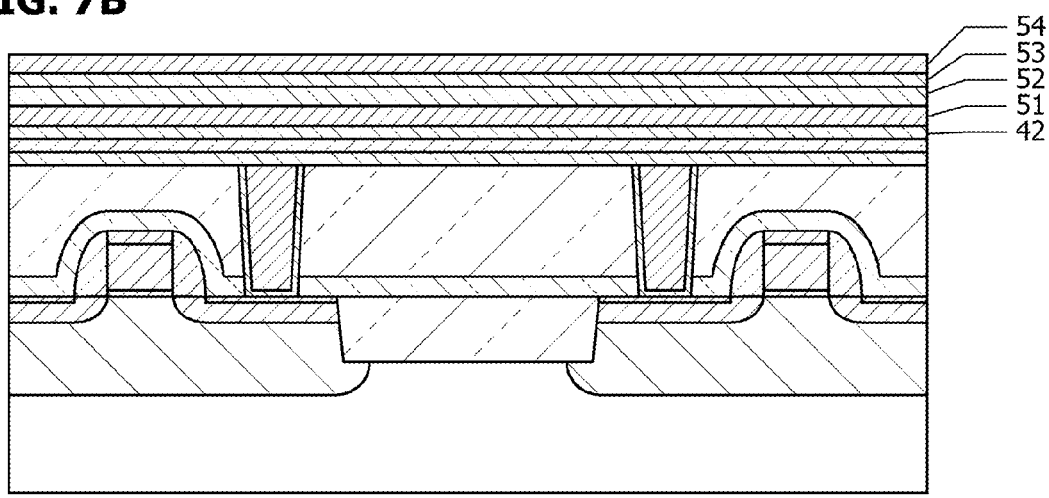

As illustrated in FIG. 7B, a lower electrode film 51, a ferroelectric film 52, an intermediate film 53, and an upper electrode film 54 are formed on the glue film 42. The formation of these films is carried out by the method according to Embodiment 1. The lower electrode film 51, the ferroelectric film 52, the intermediate film 53, and the upper electrode film 54 respectively correspond to the lower electrode film 13, the ferroelectric film 17, the intermediate film 20, and the upper electrode film 23 illustrated in FIG. 1F.

Figure 7C:
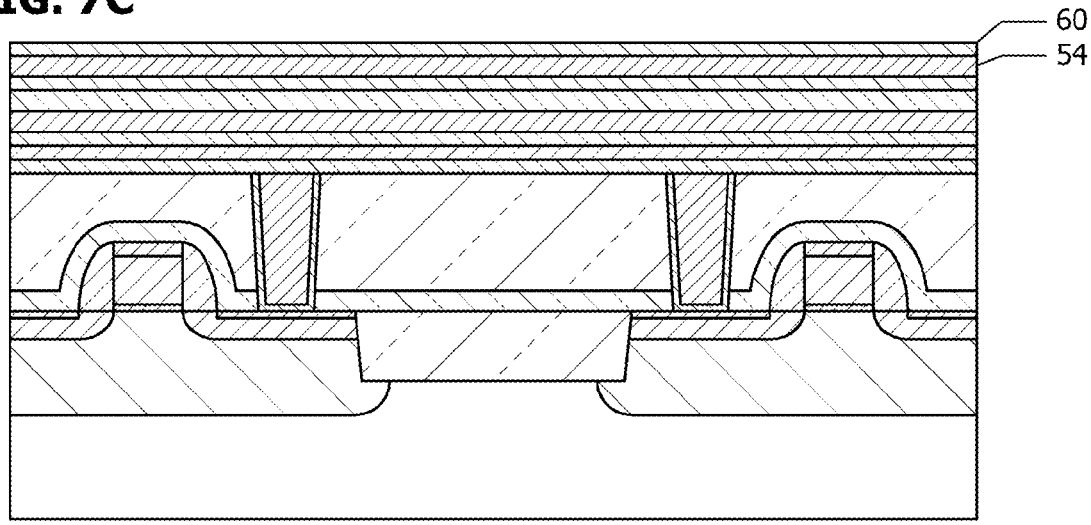

As illustrated in FIG. 7C, a hard mask film 60 of TiN or the like is formed on the upper electrode film 54. The formation of the hard mask film 60 is carried out by, for instance, sputtering. The hard mask film 60 has a thickness of, for instance, 34 nm. Useful materials for the hard mask film 60 include TaN, TiON, TiOx, TaOx, TaON, TiAlOx, TaAlOx, TiAlON, TaAlON, TiSiON, TaSiON, TiSiOx, TaSiOx, AlOx, and ZrOx, in addition to TiN.

Figure 7D:
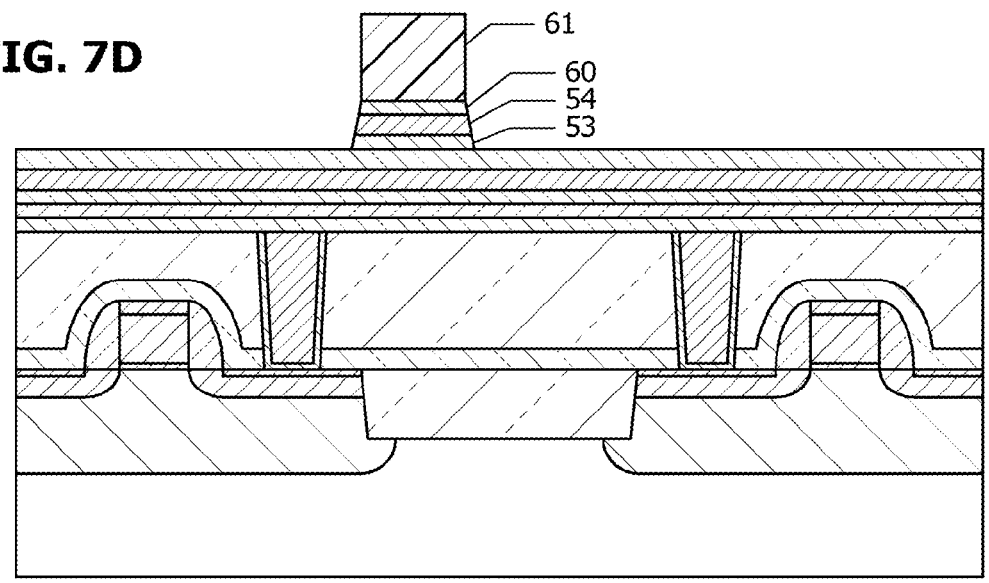

As illustrated in FIG. 7D, a resist pattern 61 is formed on the hard mask film 60. The resist pattern 61 covers the region where the upper electrode of the ferroelectric capacitor is to be formed. The hard mask film 60, the upper electrode film 54, and the intermediate film 53 are etched using the resist pattern 61 as an etching mask. This etching is carried out by plasma etching (ion milling) using a mixed gas of Ar and a small amount of $Cl_2$.

Figure 7E:
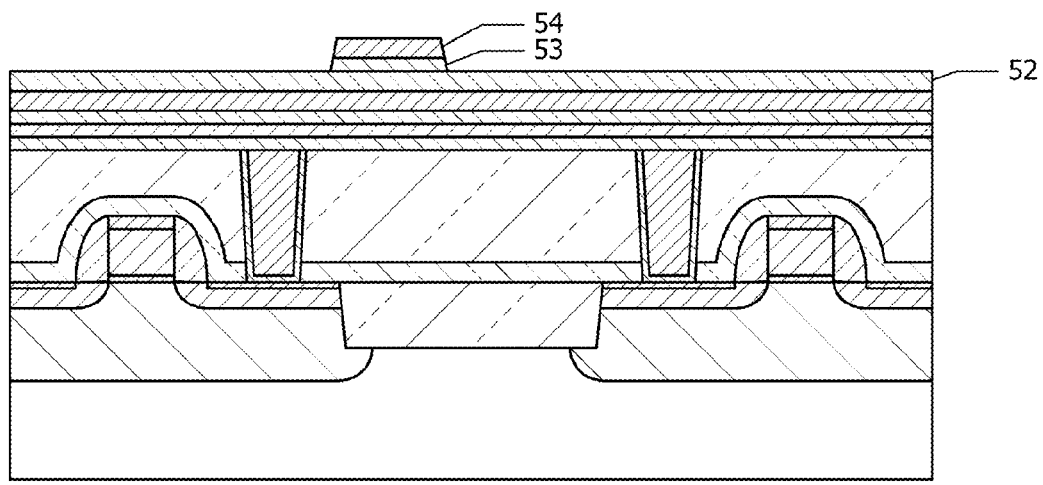

As illustrated in FIG. 7E, the resist pattern 61 (FIG. 7D) and the hard mask film 60 (FIG. 7D) are removed. After the removal of the hard mask film 60, heat treatment is carried out in an oxygen-containing atmosphere. For instance, the temperature of the heat treatment is 600° C. to 700° C., and the heat treatment time is 40 minutes. This heat treatment serves to recover the damage caused in the ferroelectric film 52.

Figure 7F:
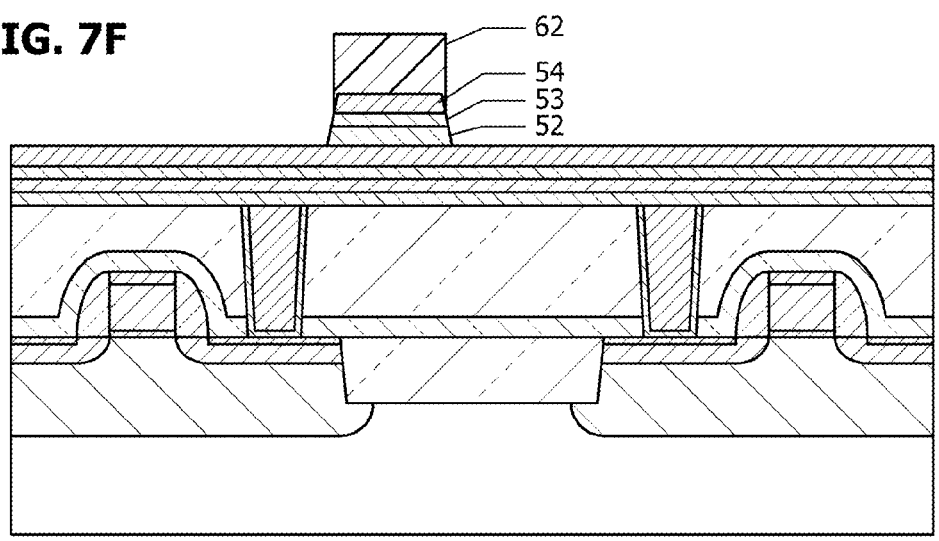

As illustrated in FIG. 7F, a resist pattern 62 is formed on the upper electrode film 54. The resist pattern 62 covers the region where the ferroelectric film of the ferroelectric capacitor is to be formed. The ferroelectric film 52 is etched using the resist pattern 62 as an etching mask. The resist pattern 62 is removed after the etching of the ferroelectric film 52.

After the removal of the resist pattern 62, heat treatment is carried out in an oxygen atmosphere. For instance, the heat treatment temperature is 300° C. to 650° C., and the heat treatment time is 30 minutes to 120 minutes.

Figure 7G:
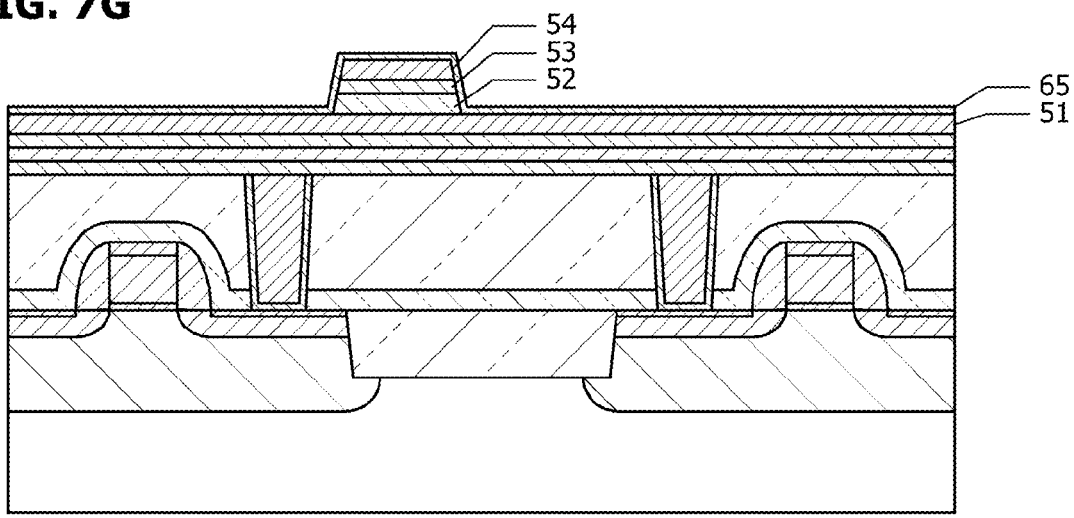

As illustrated in FIG. 7G, a protection film 65 of aluminum oxide is formed on the lower electrode film 51, the ferroelectric film 52, the intermediate film 53, and the upper electrode film 54, of which the latter three have been patterned. The formation of the protection film 65 is carried out by sputtering or CVD. The protection film 65 has a thickness in the range of, for instance, 20 nm to 50 nm. After the formation of the protection film 65, heat treatment is carried out in an oxygen atmosphere. For instance, the temperature of the heat treatment is 400° C. to 600° C., and the heat treatment time is 30 minutes to 120 minutes.

Figure 7H:
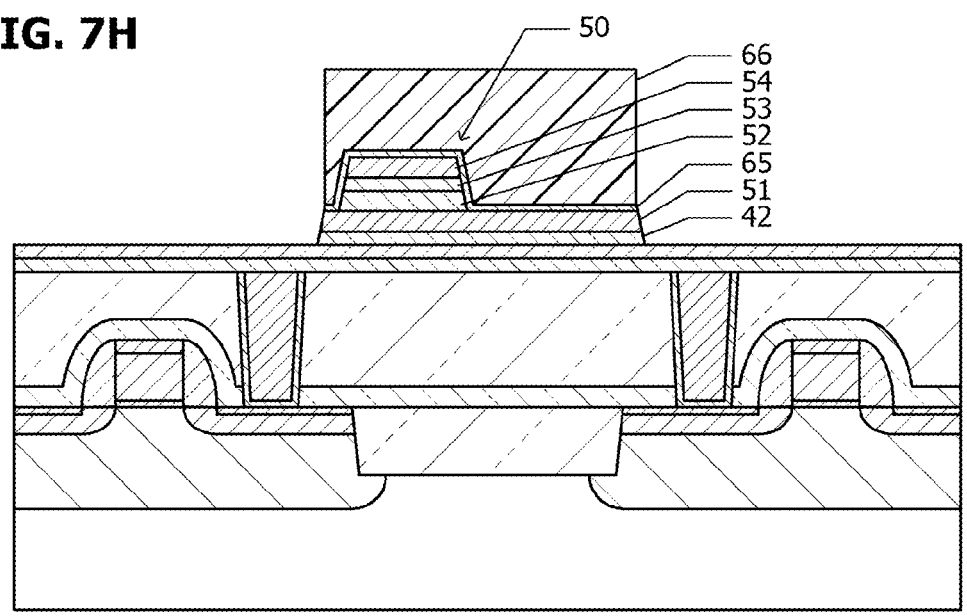

As illustrated in FIG. 7H, a resist pattern 66 is formed on the protection film 65. The resist pattern 66 covers the region where the lower electrode of the ferroelectric capacitor is to be formed. The protection film 65, the lower electrode film 51, and the glue film 42 are etched using the resist pattern 66 as an etching mask. The resist pattern 66 is removed after the etching of the glue film 42. The lower electrode film 51, the ferroelectric film 52, and the upper electrode film 54 constitute the ferroelectric capacitor 50. Here, the intermediate film 53 exists between the ferroelectric film 52 and the upper electrode film 54.

Heat treatment is carried out in an oxygen atmosphere after the removal of the resist pattern 66. For instance, the temperature of the heat treatment is 300° C. to 400° C., and the heat treatment time is 30 minutes to 120 minutes.

Figure 7I:
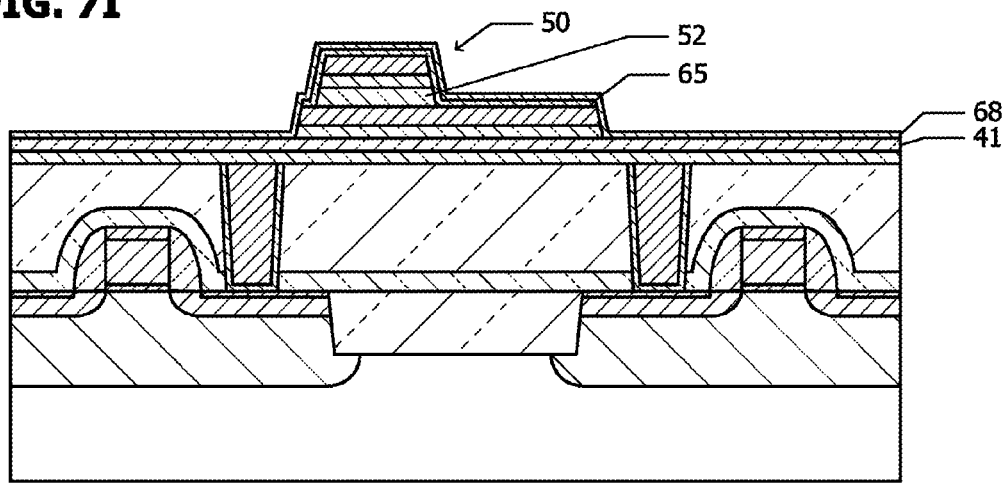

As illustrated in FIG. 7I, a protection film 68 of aluminum oxide is formed on the insulation film 41, the ferroelectric capacitor 50, and the protection film 65. The formation of the protection film 68 is carried out by sputtering or CVD. The protection film 68 has a thickness of, for instance, 20 nm. Heat treatment is carried out in an oxygen atmosphere after the formation of the protection film 68. For instance, the temperature of the heat treatment is 500° C. to 700° C., and the heat treatment time is 30 minutes to 120 minutes. This heat treatment is designed to supply oxygen to the ferroelectric film 52 to improve the electric characteristics of the ferroelectric capacitor 50.

Figure 7J:
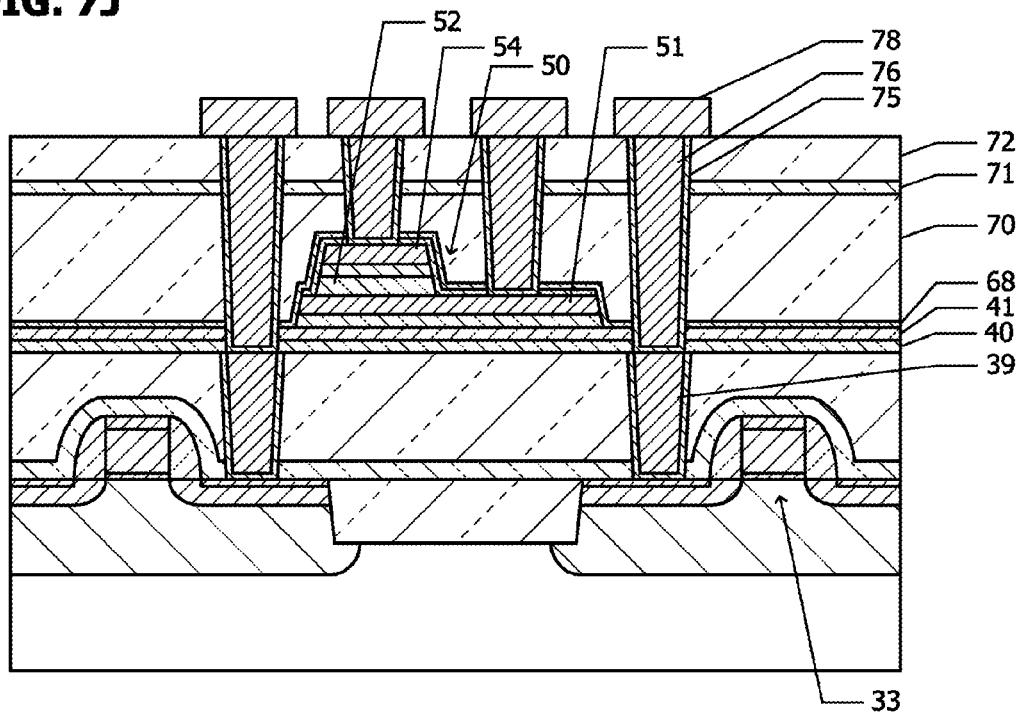
FIG. 7J is a cross section of a ferroelectric memory produced through a method according to the Embodiment 2.

As illustrated in FIG. 7J, an interlayer insulation film 70 of silicon oxide is formed on the protection film 68. The interlayer insulation film 70 has a thickness of, for instance, 1.4 µm. The deposition of the interlayer insulation film 70 is carried out by, for instance, plasma CVD using TEOS. After the deposition of the interlayer insulation film 70, CMP is carried out to make the surface even.

Heat treatment is carried out in plasma of $N_2O$ gas or $N_2$ gas after the surface of the interlayer insulation film 70 is made even. For instance, the temperature of the heat treatment is 350° C., and the heat treatment time is 2 minutes. This heat treatment removes moisture out of the interlayer insulation film 70. Furthermore, the interlayer insulation film 70 is modified to reduce its moisture absorption capability.

After the heat treatment, a protection film 71 of aluminum oxide is formed on the interlayer insulation film 70. The formation of the protection film 71 is carried out by sputtering or CVD. The protection film 71 has a thickness of, for instance, 20 nm to 50 nm.

An interlayer insulation film 72 of silicon oxide is formed on the protection film 71. The formation of the interlayer insulation film 72 is carried out by plasma CVD using TEOS. The interlayer insulation film 72 has a thickness of, for instance, 300 nm.

From the top face of the interlayer insulation film 72, a via hole that reaches the upper electrode film 54 and another via hole that reaches the lower electrode film 51 are formed. Heat treatment is carried out in an oxygen atmosphere after the formation of these via holes. For instance, the temperature of the heat treatment is 400° C. to 600° C., and the heat treatment time is 30 minutes to 120 minutes. This heat treatment is designed to supply oxygen to the ferroelectric film 52 to improve the electric characteristics of the ferroelectric capacitor 50. The heat treatment may be performed in an ozone atmosphere instead of an oxygen atmosphere.

From the top face of the interlayer insulation film 72, via holes that respectively reach the top faces of the conductive plugs 39 is formed. Heat treatment is carried out in an inert gas atmosphere after the formation of these via holes. This heat treatment is designed to degas the interlayer insulation films 70 and 72 and the insulation films 40 and 41.

The bottom of the via holes is cleaned with Ar plasma. After the cleaning, the side and bottom faces of these via holes are covered with a glue film 75. The glue film 75 may be, for instance, a TiN film with a thickness of 50 nm to 150 nm. The via holes are respectively filled with conductive plugs 76 of tungsten or the like.

Wirings 78 are formed on the interlayer insulation film 72. Each of the wirings 78 has a laminated structure consisting of, for instance, a TiN film, an AlCu alloy film, a Ti film, and a TiN film, laminated in the recited order.

Figure 8:
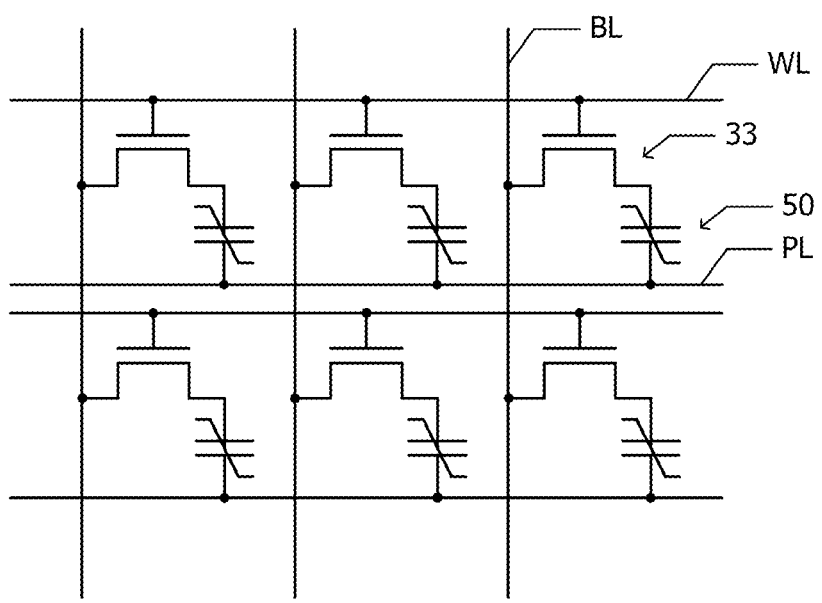
FIG. 8 is an equivalent circuit schematic of a ferroelectric memory.

FIG. 8 illustrates an equivalent circuit for the ferroelectric memory. A memory cell is located at each of the intersections of word lines WL extending in the horizontal direction and bit lines BL extending in the vertical direction. Each memory cell is composed of the MOS transistor 33 (FIG. 7J) and the ferroelectric capacitor 50 (FIG. 7J). A plate line PL is provided for each word line WL.

The gate electrode of the MOS transistor 33 is connected to the word line WL. The source is connected to the bit line BL, and the drain is connected to an electrode of the ferroelectric capacitor 50. The other electrode of the ferroelectric capacitor 50 is connected to the plate line PL. If a signal is applied to a word line WL to turn on the MOS transistor 33, a voltage corresponding to the electric potential difference between the bit line BL and the plate line PL is applied to the ferroelectric capacitor 50 and data are written. When the MOS transistor 33 is turned on, furthermore, an electric signal is output to the bit line BL, correspondingly to the polarity of spontaneous polarization of the ferroelectric capacitor 50, and data are read out.

In Embodiment 2, the ferroelectric capacitors 50 are formed by applying the method of Embodiment 1. As a result, ferroelectric capacitors 50 with a large value of Qsw were obtained.

Embodiment 3

Figure 9:
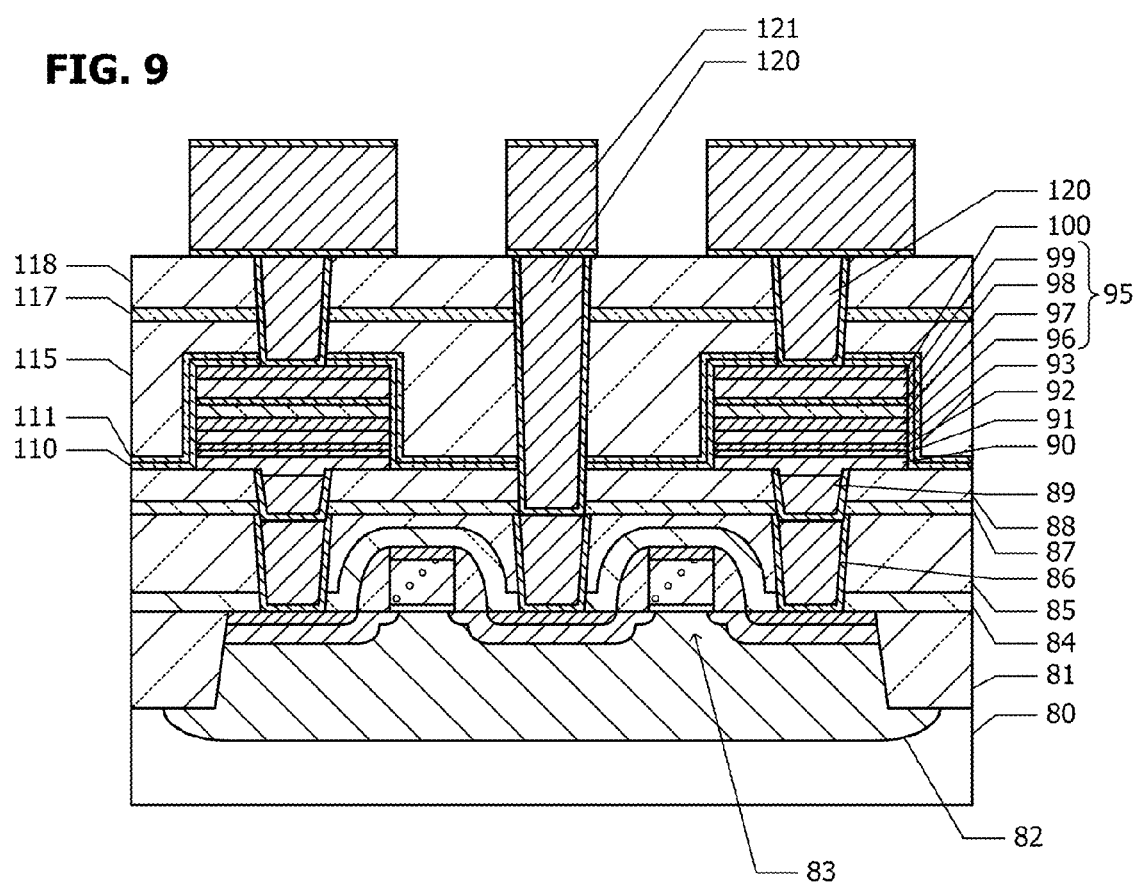
FIG. 9 is a cross section of a ferroelectric memory produced through a method according to Embodiment 3.

FIG. 9 illustrates a cross section of a ferroelectric memory according to Embodiment 3. The ferroelectric memory according to Embodiment 2 is a so-called planer type memory including a ferroelectric capacitor provided on an even insulation film. The ferroelectric memory according to Embodiment 3, on the other hand, is a so-called stack type memory including a ferroelectric capacitor provided on an conductive plug.

As illustrated in FIG. 9, a device-separating insulation film 81 is provided on the surface layer of the semiconductor substrate 80 consisting of silicon. The active regions are defined by the device-separating insulation film 81. A p-type well 82 is located in the surface layer in the active region. Two MOS transistors 83 are located in the active region.

The memory cell that contains a MOS transistor 83 and the memory cell that contains the other MOS transistor 83 have the same structure, and therefore, the structure of a memory cell that contains a MOS transistor 83 is described below.

An insulation film 84 of silicon oxynitride with a thickness of 200 nm is formed on the semiconductor substrate 80 to cover the MOS transistor 83. An interlayer insulation film 85 of silicon oxide is provided on the insulation film 84. The interlayer insulation film 85 has an even surface, and the thickness of the interlayer insulation film 85 in an even region of the substrate is, for instance, 700 nm.

In the interlayer insulation film 85 and the insulation film 84, there are two via holes, i.e. one reaching the source region and another reaching the drain region of the MOS transistor 83. The via holes have a diameter of about 0.25 μm. The inner faces of these via holes are covered with a glue film, and each via hole is filled with a conductive plug 86 of tungsten (W). One of the conductive plugs 86 is connected to the drain region, and the other conductive plug 86 is connected to the source region. The glue film consists of two layers, i.e. a Ti film with a thickness of 30 nm and a TiN film with a thickness of 20 nm, laminated in the recited order.

An oxidation inhibiting film 87 of silicon oxynitride with a thickness of 130 nm is formed on the interlayer insulation film 85. An interlayer insulation film 88 with a thickness of 300 nm is formed on the oxidation inhibiting film 87.

A via hole that reaches the top face of one of the conductive plugs 86 is formed through the interlayer insulation film 88 and the oxidation inhibiting film 87. The via hole has a diameter of about 0.25 μm. The inner face of the via hole is covered with a glue film, and the via hole is filled with a conductive plug 89 of W. The glue film consists of two layers, i.e. a Ti film with a thickness of 30 nm and a TiN film with a thickness of 20 nm, laminated in the recited order. The conductive plug 89 is connected to the drain region via the conductive plug 86 provided below.

A ferroelectric capacitor 95 is provided on the electrically conductive plug 89 and the interlayer insulation film 88 in such a manner that the ferroelectric capacitor 95 includes the conductive plug 89 thereinside in the planar view. The ferroelectric capacitor 95 has a laminated structure consisting of the lower electrode film 96, the ferroelectric film 97, the intermediate film 98, and the upper electrode film 99, laminated in the recited order. The formation of the lower electrode film 96, the ferroelectric film 97, the intermediate film 98, and the upper electrode film 99 is carried out by the method according to Embodiment 1.

Four layers, i.e. a conductive base film 90, a crystallinity improving film 91, a glue film 92, and an oxygen barrier film 93, laminated in the recited order from the substrate side, are provided between the ferroelectric capacitor 95 and the top face of the conductive plug 89 and interlayer insulation film 88. A hydrogen barrier film 100 is provided on the ferroelectric capacitor 95.

The conductive base film 90 is formed of (111) oriented TiN and has a thickness of 100 nm. The top face of the conductive plug 89 is located slightly lower than the top face of the surrounding interlayer insulation film 88 to form a recessed portion. This recessed portion is completely filled with the conductive base film 90, and the conductive base film 90 has an even top face.

The crystallinity improving film 91 is formed of (111) oriented TiN and has a thickness of 20 nm. The glue film 92 is formed of (111) oriented iridium (Ir). The oxygen barrier film 93 is formed of TiAlN, has a thickness of 100 nm, and serves to prevent the underlying conductive plug 89 from being oxidized. The hydrogen barrier film 100 is formed of Ir, and has a thickness of 100 nm.

A protection film 110 is provided to cover the top face of the laminated structure consisting of layers from the conductive base film 90 to the hydrogen barrier film 100, as well as the top face of the interlayer insulation film 88, and a protection film 111 is provided on the protection film 110. Each of the protection film 110 and the protection film 111 is made of aluminum oxide and has a thickness of about 20 nm. After the formation of the protection film 110, heat treatment is carried out in an oxygen atmosphere before forming the protection film 111.

An interlayer insulation film 115 of silicon oxide is provided on the protection film 111. The interlayer insulation film 115 has an even top face. A barrier film 117 of aluminum oxide is provided on the even face of the interlayer insulation film 115. The barrier film 117 has a thickness in the range of 20 nm to 100 nm. An interlayer insulation film 118 of silicon oxide with a thickness of 800 nm to 1000 nm is provided on the barrier film 117.

A via hole that reaches the hydrogen barrier film 100 on the capacitor 95 is provided through the five layers from the protection film 110 to the interlayer insulation film 118. The inner face of the via hole is covered with a glue film, and the via hole is filled with the conductive plug 120 of W. In addition, a via hole that reaches the conductive plug 86 is provided through the seven layers from the oxidation inhibiting film 87 to the interlayer insulation film 118. The inner face of the via hole is covered with a glue film, and the via hole is filled with the conductive plug 120 of W. These glue films may be a single layer of TiN or consist of two layers of Ti film and TiN film.

Wirings 121 are provided on the interlayer insulation film 118. The wirings 121 have a five layer structure consisting of a Ti film, a TiN film, an AlCu alloy film, a Ti film, and a TiN film, laminated in the recited order.

The equivalent circuit for the ferroelectric memory according to Embodiment 3 is the same as that according to Embodiment 2 illustrated in FIG. 8. For Embodiment 3 as well, the method according to Embodiment 1 is applied to form the ferroelectric capacitor 95. Consequently, the ferroelectric capacitor 95 with a large value of Qsw can be produced.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiments of the present invention have been described in detail, it should be understood that the various changes, substitutions, and alterations could be made hereto without departing from the spirit and scope of the invention.

What is claimed is:

1. A ferroelectric capacitor comprising:
   a lower electrode formed above a substrate;
   a ferroelectric film comprising columnar crystal grains, the ferroelectric film being located above the lower electrode;
   an intermediate film located above the ferroelectric film and made of a perovskite-type conductive oxide, the intermediate film comprising columnar crystal grains;
   a first upper electrode located above the intermediate film and made of oxide of at least one metal selected from a group consisting of Pt, Pd, Rh, Ir, Ru, and Os, the first upper electrode comprising columnar crystal grains; and
   an amorphous or microcrystalline second upper electrode located above the first upper electrode and made of oxide of at least one metal selected from a group consisting of Pt, Pd, Rh, Ir, Ru, and Os.

2. The ferroelectric capacitor according to claim 1, wherein the crystal grains in the intermediate film are distributed correspondingly to the crystal grains in the ferroelectric film.

3. The ferroelectric capacitor according to claim 1, wherein a size of the crystal grains in the first upper electrode measured in an in-plane direction is smaller than a size of the crystal grains in the ferroelectric film measured in the in-plane direction.

4. The ferroelectric capacitor according to claim 1, wherein the intermediate film has a thickness in a range of 1 nm to 5 nm.

5. The ferroelectric capacitor according to claim 1, wherein the first upper electrode has a thickness in a range of 10 nm to 70 nm.

6. The ferroelectric capacitor according to claim 1, wherein the crystal grains in the first upper electrode has a size in a range of 1 nm to 10 nm in an in-plane direction.

7. The ferroelectric capacitor according to claim 1, wherein the intermediate film comprises a conductive material containing Sr, Ru, and O, a conductive material containing Sr, Ti, and O, a conductive material containing La, Sr, Mn, and O, or a conductive material containing La, Sr, Co, and O.

* * * * *